(12) United States Patent
Leobandung

(10) Patent No.: US 10,777,567 B2
(45) Date of Patent: Sep. 15, 2020

(54) EPITAXY LATERAL OVERGROWTH FOR 3D NAND

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/109,058

(22) Filed: Aug. 22, 2018

(65) Prior Publication Data

US 2020/0066740 A1    Feb. 27, 2020

(51) Int. Cl.
*H01L 27/11556* (2017.01)
*H01L 21/02* (2006.01)
(Continued)

(52) U.S. Cl.
CPC .... *H01L 27/11556* (2013.01); *H01L 21/0262* (2013.01); *H01L 21/02532* (2013.01); *H01L 21/02546* (2013.01); *H01L 21/02631* (2013.01); *H01L 21/02636* (2013.01); *H01L 21/76892* (2013.01); *H01L 27/11521* (2013.01); *H01L 27/11526* (2013.01); *H01L 29/1037* (2013.01); *H01L 29/40114* (2019.08); *H01L 21/02164* (2013.01); *H01L 21/02576* (2013.01); *H01L 21/02579* (2013.01); *H01L 21/31053* (2013.01)

(58) Field of Classification Search
CPC ......... H01L 27/11556; H01L 29/40114; H01L 29/1037; H01L 21/02546; H01L 21/02532; H01L 21/02631; H01L 27/11526; H01L 21/76892; H01L 27/11521; H01L 21/0262; H01L 21/02636; H01L 21/02576; H01L 21/02579; H01L 21/02164; H01L 21/31053
See application file for complete search history.

(56) References Cited

U.S. PATENT DOCUMENTS 9,287,290 B1    3/2016 Rabkin et al.
9,793,283 B1    1/2017 Pang et al.
(Continued)

FOREIGN PATENT DOCUMENTS

CN    107452642 A    12/2017
KR    20180034326 A    4/2018

OTHER PUBLICATIONS

Capogreco et al., "Feasibility of In x Ga 1—x As High Mobility Channel for 3-D NAND Memory," IEEE Transactions on Electron Devices, Jan. 2017, vol. 64, No. 1, pp. 130-136.

*Primary Examiner* — Su C Kim
(74) *Attorney, Agent, or Firm* — Yee & Associates, P.C.

(57) ABSTRACT

A three dimension Not AND (NAND) memory structure with a floating gate and a method for fabricating the same are provided. In an embodiment, a method for fabricating a 3D NAND structure includes forming a word line stack on a dielectric cap covering a semiconductor substrate. The method also includes forming a hole through the word line stack and the dielectric cap and forming a floating gate trap on a surface of the hole. The method also includes epitaxially growing a semiconductor such as silicon in the hole to form a device channel with substantially uniform grain. The method also includes forming a bit line over the channel.

18 Claims, 14 Drawing Sheets

(51) Int. Cl.
*H01L 27/11526* (2017.01)
*H01L 21/768* (2006.01)
*H01L 29/10* (2006.01)
*H01L 27/11521* (2017.01)
*H01L 21/28* (2006.01)
*H01L 21/3105* (2006.01)

(56) References Cited

U.S. PATENT DOCUMENTS

| | | |
|---|---|---|
| 9,576,788 B2 | 2/2017 | Liu et al. |
| 9,972,640 B1 * | 5/2018 | Kai .................... H01L 27/11519 |
| 2015/0076586 A1 * | 3/2015 | Rabkin .............. G11C 16/0483 257/324 |
| 2017/0018570 A1 | 1/2017 | Lue et al. |

* cited by examiner

US 10,777,567 B2

EPITAXY LATERAL OVERGROWTH FOR 3D NAND

BACKGROUND

1. Field

The disclosure relates generally to semiconductor structures and, more specifically, to a three-dimensional NAND memory and methods of making the three-dimensional NAND memory.

2. Description of the Related Art

Semiconductor fabrication involves manufacturing integrated circuits in semiconductor substrates. The process involves forming transistors and other devices directly in semiconductor substrates, such as silicon. One type of semiconductor device that has gained popularity recently is a Not AND (NAND) logic gate memory. A NAND logic gate memory is a type of memory that uses NAND logic to form memory cells. Planar NAND (aka, 2D NAND) uses a single layer of memory cells. To achieve higher densities of memory cells at a lower cost per bit, manufacturers have developed 3D NAND. 3D NAND is a type of memory in which the memory cells are stacked vertically in multiple layers. However, current 3D NAND structures include floating gates that suffer from fluctuations in threshold voltage.

SUMMARY

According to one embodiment of the present invention, a method for fabricating a three-dimensional (3D) Not AND (NAND) memory structure is provided. The method includes forming a word line stack on a dielectric cap covering a semiconductor substrate. The method also includes forming a hole through the word line stack and the dielectric cap and forming a floating gate trap on a surface of the hole. The method also includes epitaxially growing a semiconductor such as silicon in the hole to form a channel with substantially uniform grain. The method also includes forming a bit line over the channel.

According to another embodiment of the present invention, a 3D NAND memory structure is provided. The 3D NAND memory structure includes a bit line, a floating gate, and a word line stack. The floating gate includes a device channel. The device channel includes a semiconductor with a substantially uniform crystal orientation. The word line stack includes a first portion and a second portion. The first portion is separated from the second portion by the floating gate.

DETAILED DESCRIPTION

Figure 1:
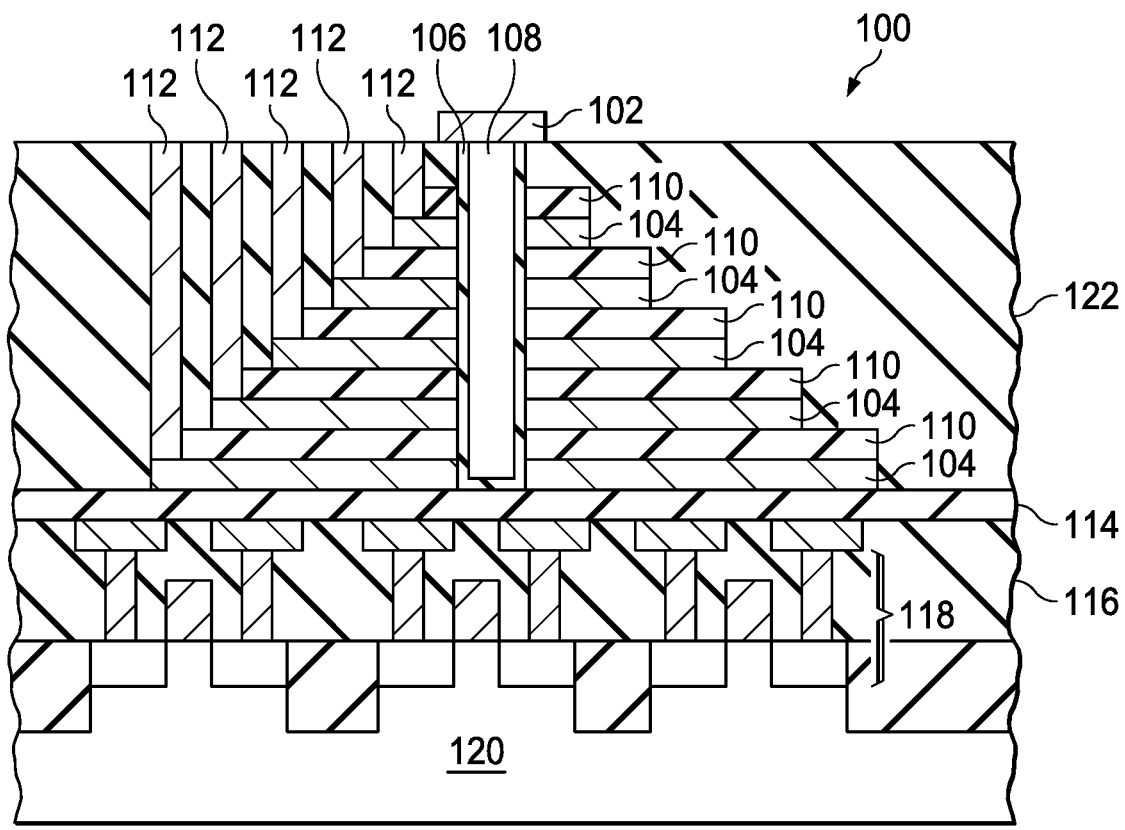
FIG. 1 is a cross-sectional view of a 3D NAND structure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on," "directly over," or "on and in direct contact with" another element, there are no intervening elements present, and the element is in contact with another element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross sections of a portion of an integrated circuit during fabrication and are not drawn to scale, but instead are drawn so as to illustrate different illustrative features of the disclosure.

With reference now to the figures and, in particular, with reference to FIG. 1, a cross-sectional view of a NAND structure 100 is depicted. NAND structure 100 includes a substrate 120 over which logic elements 118 reside embedded in a Inter Level Dielectric (ILD) oxide 116. A dielectric cap 114 separates the logic elements 118 from the remainder of the NAND structure 100. NAND structure 100 also includes a plurality of word lines 104 and word line contacts 112. Each word line 104 is separated from a next word line 104 by a respective insulation layer 110. NAND structure 100 also includes a bit line 102 and a floating gate stack 106 that surrounds the device channel 108. The floating gate stack 106 includes a channel gate dielectric. The floating gate stack 106 and the device channel 108 separate two sides of each of the word lines 104. The floating gate stack 106 is substantially cylindrical.

Current NANDs typically use polysilicon as the device channel 108. However, polysilicon channels have non-uniform grain (i.e., the crystal orientations of the semiconductor material in polysilicon are not uniform), thereby causing significant threshold voltage ($V_{th}$) fluctuation. Therefore, the performance of the NAND is degraded and less than ideal because of the non-uniformity of the device channel 108. Consequently, it is desirable to have an improved NAND and process of making the NAND that results in a more uniform $V_{th}$.

With reference to FIGS. 2-10, cross-sectional views of an illustrative example of a NAND structure at various stages of fabrication, showing an illustrative example process for forming a floating gate in a 3D NAND structure, are depicted in accordance with an illustrate embodiment. In the interest of not obscuring the presentation of the illustrative examples, some processing steps or operations in the illustrative examples that are known, may have been combined together for presentation and for illustration purposes and in some instances, may have not been described in detail. In other instances, some processing steps or operations that are known in the art may not be described at all. It should be understood that the following description is rather focused on the distinctive features or elements of various examples.

Figure 2:
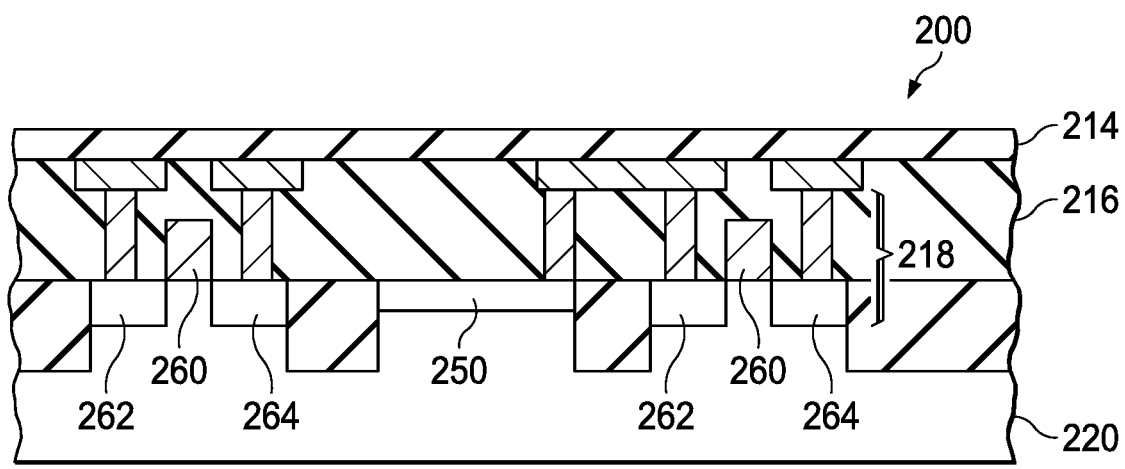
FIG. 2 is a cross-sectional view of a 3D NAND structure in accordance with an illustrative embodiment.

With reference now to FIG. 2, a cross-sectional view of a 3D NAND structure 200 is depicted in accordance with an illustrative embodiment. 3D NAND structure 200 includes a semiconductor substrate 220, an Inter Level Dielectric (ILD) oxide 216, and a plurality of logic components 218 each with a corresponding logic gate 260, source 262, and drain 264. The 3D NAND structure 200 also includes a conductive silicon layer 250 which can be p-type or n-type doped silicon layer connected to ground, and a dielectric cap 214. The conductive silicon layer 250 provides a connection to ground and provides a silicon seed to epitaxially grow the device channel.

Figure 3:
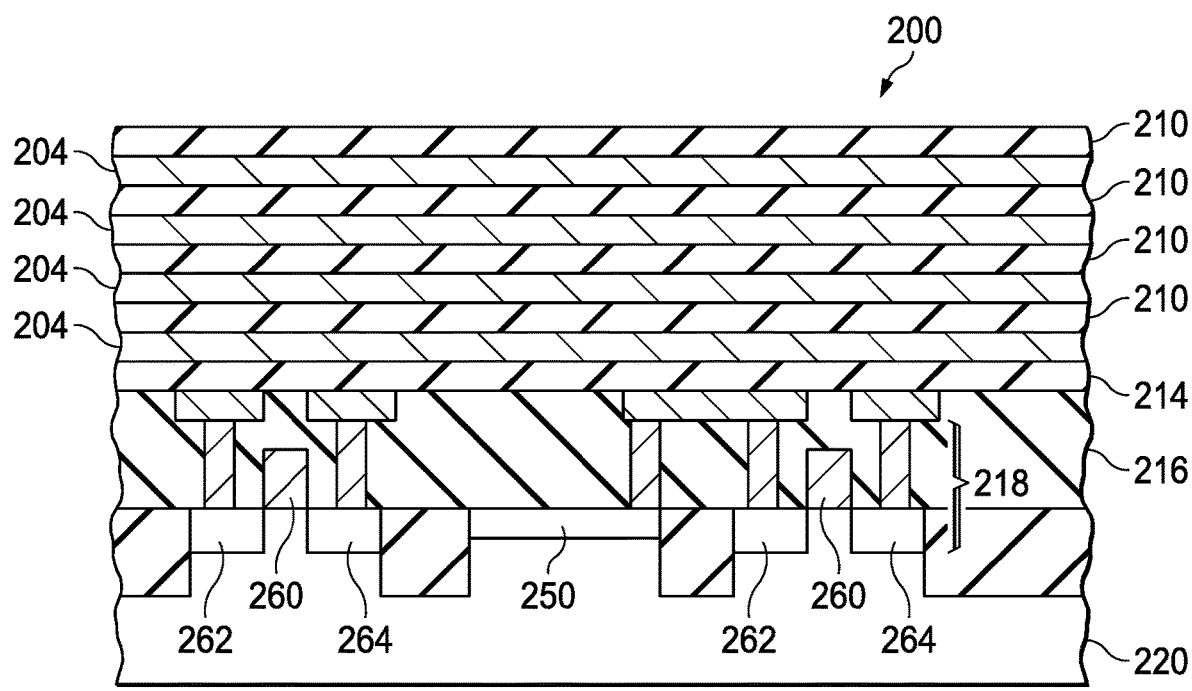
FIG. 3 is a cross-sectional view of a 3D NAND structure after forming a plurality of stacked word lines in accordance with an illustrative embodiment.

In FIG. 3, a cross-sectional view of 3D NAND structure 200 after forming a plurality of stacked word lines 204 is depicted in accordance with an illustrative embodiment. In this cross-sectional view, each of the stacked word lines 204 is separated from a next word line 204 by an insulation layer 210. The word lines 204 are formed from a metal such as, for example, tungsten (W), titanium nitride (TiN), etc. or formed from doped polysilicon. In an embodiment, the word lines 204 are formed by depositing alternating layers of word lines 204 and insulation layers 210 over the top of the dielectric cap 214. Although four word lines 204 are depicted, any number of word lines 204 may be formed. The insulation layers 210 may be formed from, for example, silicon dioxide (SiO2).

Figure 4:
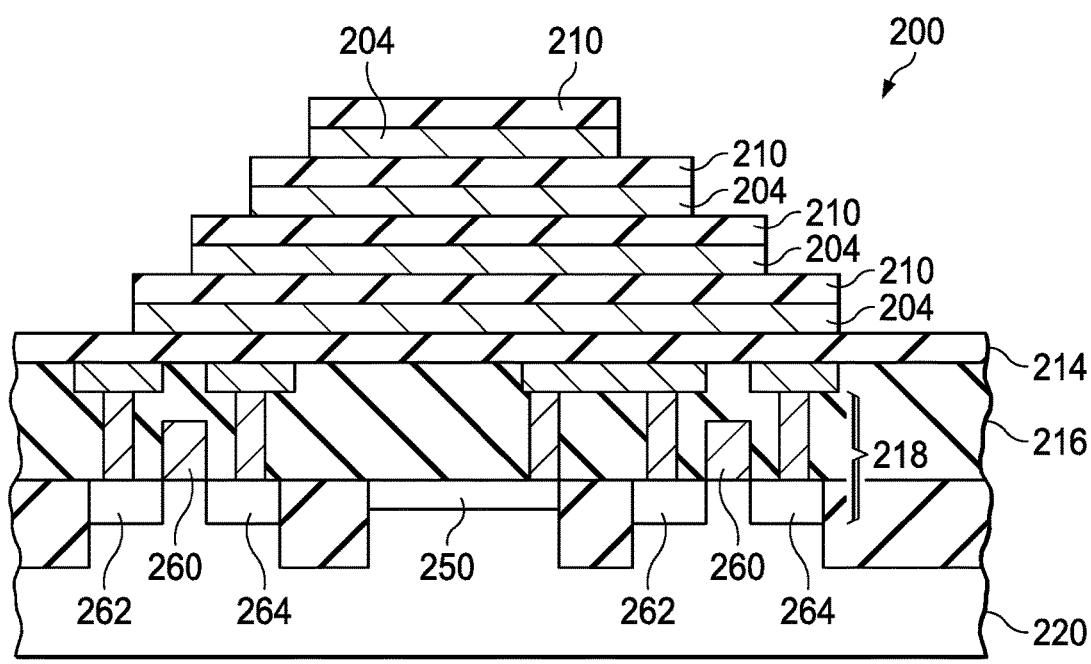
FIG. 4 is a cross-sectional view of a 3D NAND structure after patterning the word line stack to produce a patterned word line stack in accordance with an illustrative embodiment.

In FIG. 4, a cross-sectional view of 3D NAND structure 200 after patterning the word line stack to produce a patterned word line stack is depicted in accordance with an illustrative embodiment. In this cross-sectional view, the stacked word lines 204 and the insulation layers 210 have been patterned into a stair case structure to facilitate forming word line contacts with the word lines 204.

Figure 5:
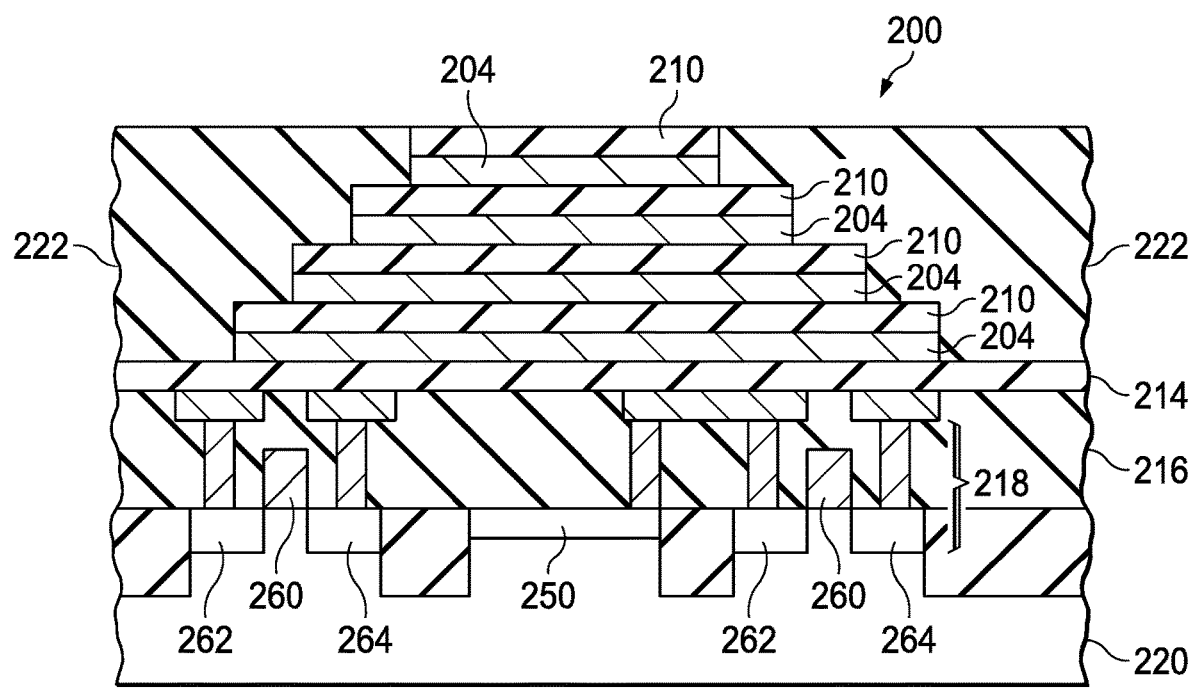
FIG. 5 is a cross-sectional view of a 3D NAND structure after planarizing with a dielectric in accordance with an illustrative embodiment.

In FIG. 5, a cross-sectional view of 3D NAND structure 200 after planarizing with a dielectric is depicted in accordance with an illustrative embodiment. In this cross-sectional view, the 3D NAND structure 200 has been planarized with a dielectric 222. In an embodiment, the dielectric 222 includes ILD oxide.

Figure 6:
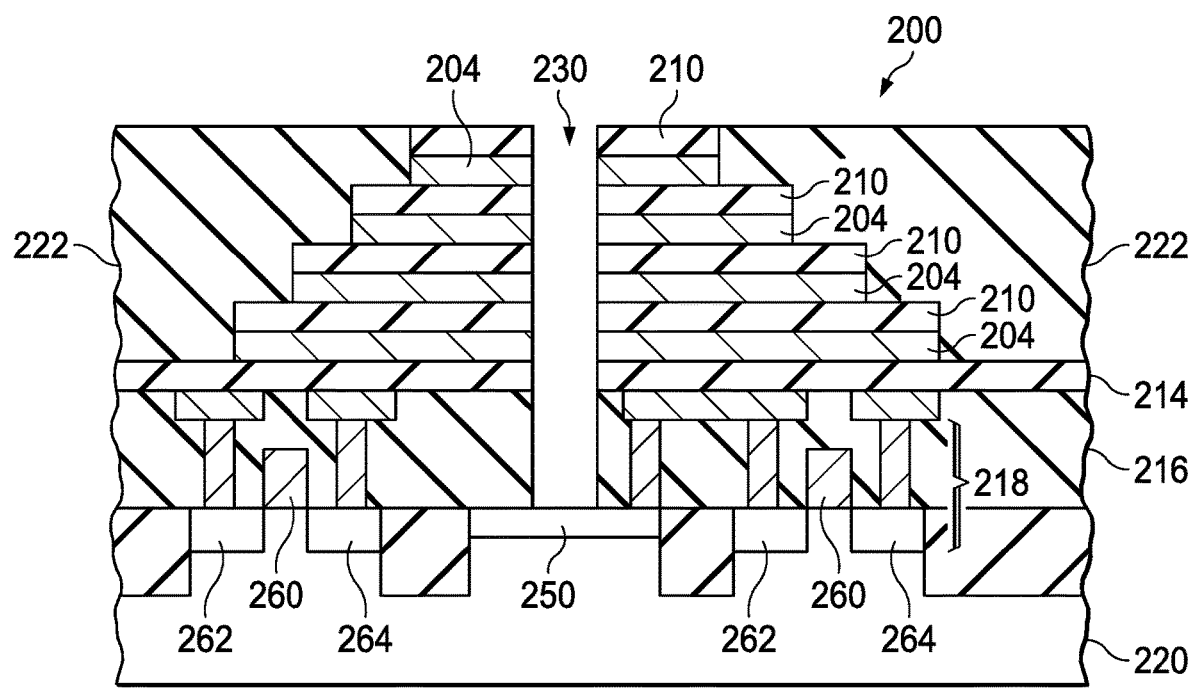
FIG. 6 is a cross-sectional view of a 3D NAND structure after a hole for a channel has been etched in accordance with an illustrative embodiment.

In FIG. 6, a cross-sectional view of 3D NAND structure 200 after a hole for a channel has been etched, is depicted in accordance with an illustrative embodiment. In this cross-sectional view, the 3D NAND structure 200 has had a hole 230 etched through the stacked word lines 204, the insulation layers 210, the dielectric cap 214, and the ILD oxide 216 such that the hole extends down to doped silicon layer 250.

Figure 7:
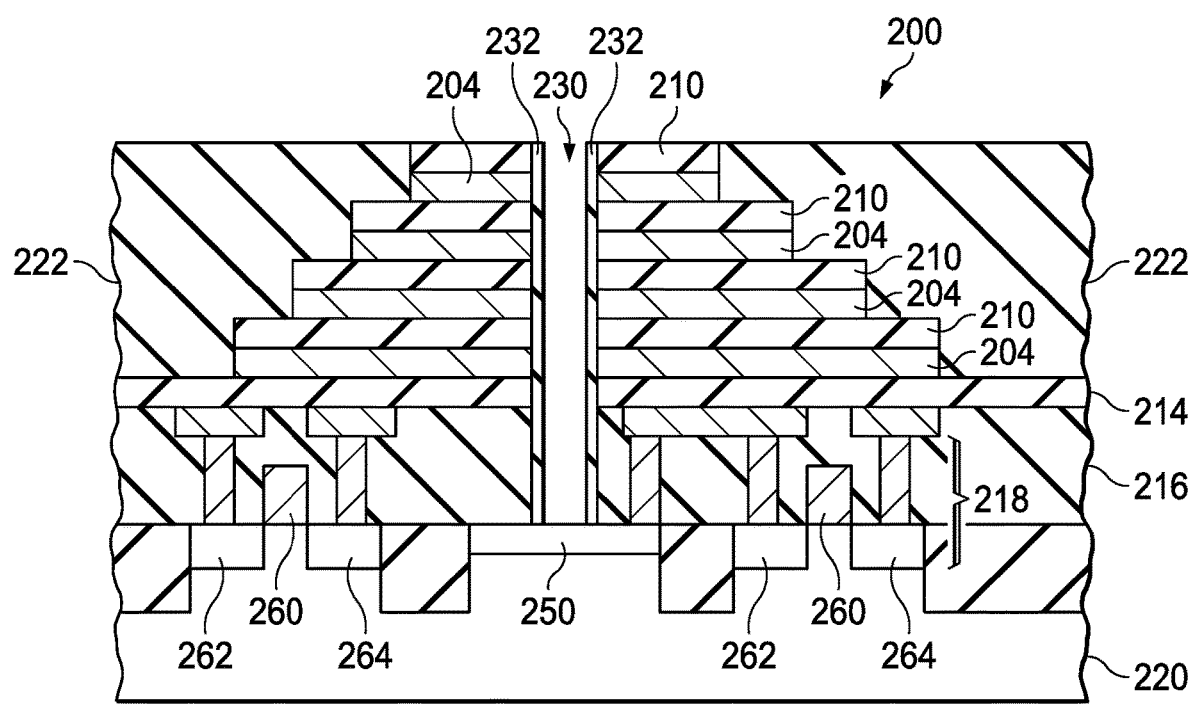
FIG. 7 is a cross-sectional view of a 3D NAND structure after a floating gate trap and a gate dielectric have been formed in accordance with an illustrative embodiment.

In FIG. 7, a cross-sectional view of 3D NAND structure 200 after a floating gate trap and a gate dielectric have been formed, is depicted in accordance with an illustrative embodiment. In this cross-sectional view, the 3D NAND structure 200 has had a floating gate trap and gate dielectric deposited on the sides 232 of the hole 230 and is etched from the bottom. For example, the floating gate trap and gate dielectric may be formed from SiO—SiN—SiO or other high-k dielectric with a charge trap.

Figure 8:
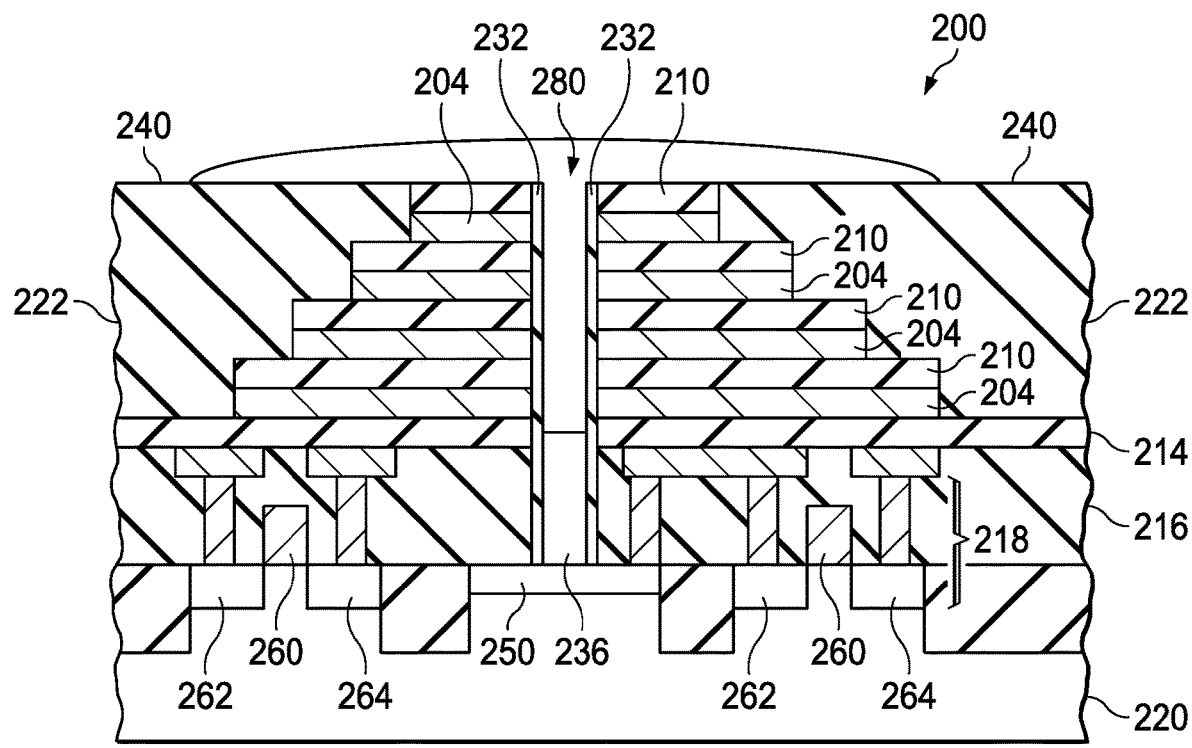
FIG. 8 is a cross-sectional view of a 3D NAND structure after an epitaxy lateral overgrowth has been formed in the hole and over the top surface of the NAND structure in accordance with an illustrative embodiment.

In FIG. 8, a cross-sectional view of 3D NAND structure 200 after an epitaxy lateral overgrowth has been formed in the hole and over the top surface of the NAND structure 200, is depicted in accordance with an illustrative embodiment. In this cross-sectional view, a device channel 280 has been epitaxially grown in the hole and has been laterally grown over the top surface 240 of the NAND structure 200. The epitaxial grown semiconductor may be selected from a group that includes, for example, silicon, germanium, and gallium arsenide. The method of epitaxially growing the channel may be, for example, one of vapor-phase epitaxy (VPE), chemical vapor deposition (CVD), molecular-beam epitaxy (MBE), and liquid-phase epitaxy (LPE). The resultant epitaxy lateral overgrowth results in a device channel 280 that is substantially uniform in crystal orientation of the semiconductor. The lower region 236 of the device channel 280, formed in the hole, may include a higher p-doped region than the semiconductor above this region 236. The higher p-doped region 236 may be grown with a dopant selected from a group that includes, for example, boron or Indium. In another embodiment, the lower region 236 is a higher n-type doped region.

Figure 9:
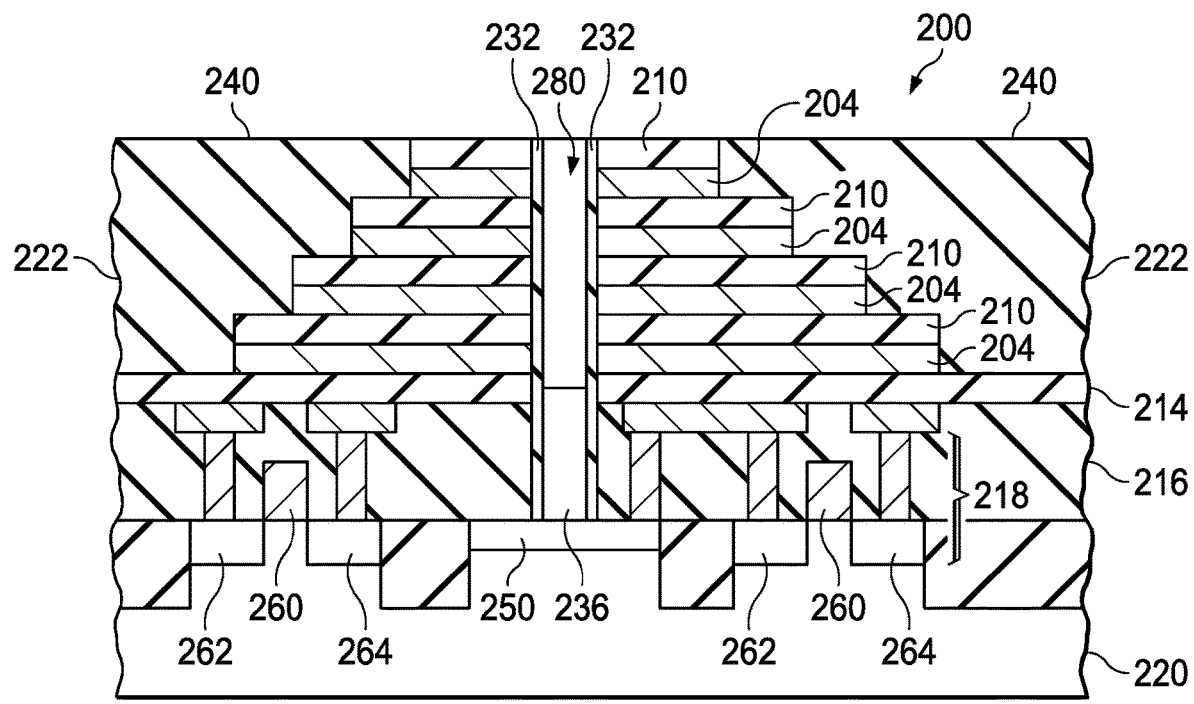
FIG. 9 is a cross-sectional view of a 3D NAND structure after polishing the surface of the 3D NAND structure in accordance with an illustrative embodiment.

In FIG. 9, a cross-sectional view of 3D NAND structure 200 after polishing the surface of the 3D NAND structure 200 is depicted in accordance with an illustrative embodiment. In this cross-sectional view, the top surface 240 of the 3D NAND 200 has been polished to remove the excess semiconductor formed from the epitaxy lateral overgrowth.

Figure 10:
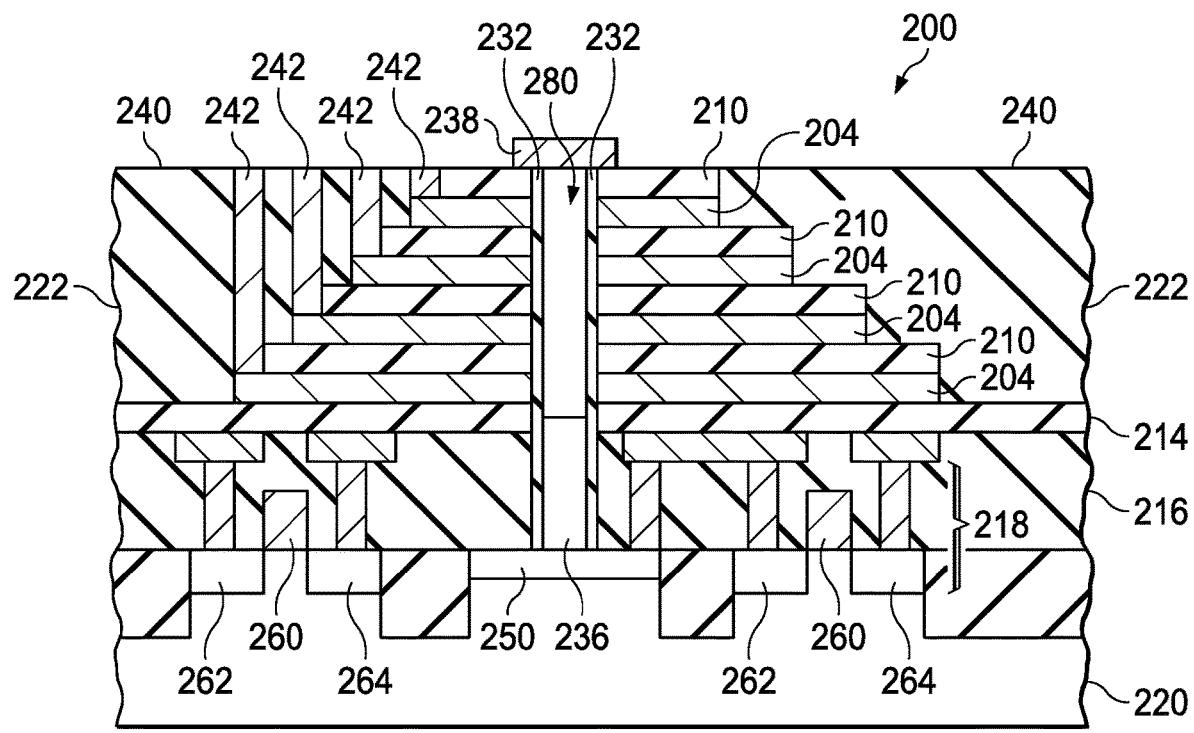
FIG. 10 is a cross-sectional view of a 3D NAND structure after a bit line and word line contacts have been formed in accordance with an illustrative embodiment.

In FIG. 10, a cross-sectional view of 3D NAND structure 200 after a bit line 238 and word line contacts 242 have been formed, is depicted in accordance with an illustrative embodiment. The resultant 3D NAND structure 200 as depicted in FIG. 10 includes a device channel 280 in the hole that has substantially uniform crystalline orientation. This results in less threshold voltage fluctuation across the floating gate, for which the channel forms a part, than the threshold voltage fluctuation of 3D NAND, that utilizes polysilicon as the channel, as depicted in FIG. 1.

Turning now to FIGS. 11-18, cross-sectional views of an alternative illustrative examples of a NAND structure at various stages of fabrication, showing an illustrative example process for forming a floating gate in a 3D NAND structure, are depicted in accordance with an illustrate embodiment.

Figure 11:
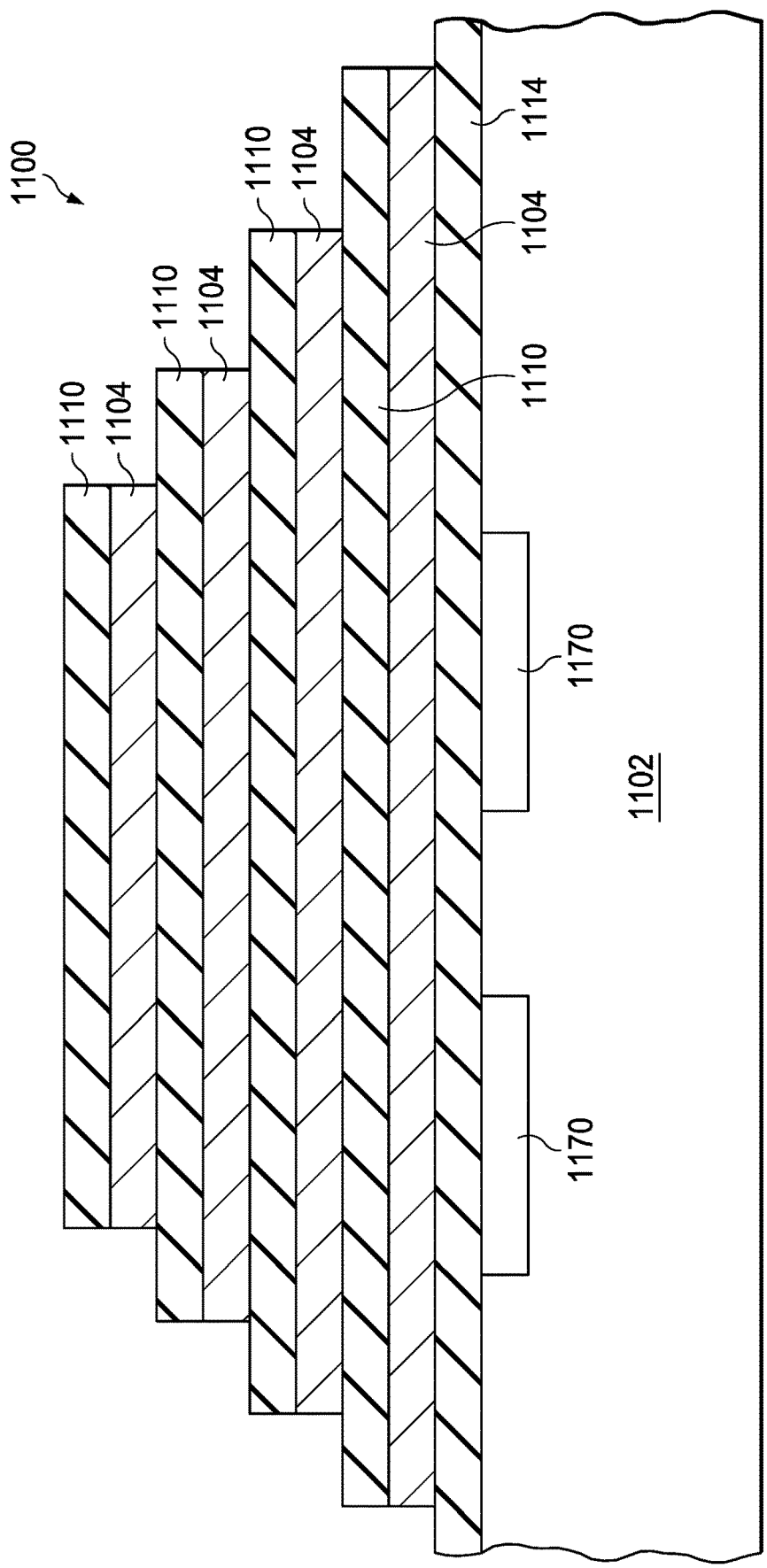
FIG. 11 is a cross-sectional view of a 3D NAND structure in accordance with an illustrative embodiment.

With reference now to FIG. 11, a cross-sectional view of a 3D NAND structure 1100 is depicted in accordance with an illustrative embodiment. 3D NAND structure 1100 includes a substrate 1102, doped silicon layers 1170, and a dielectric cap 1114. The doped silicon layers 1170 provide a connection to both ground and seed layer for epitaxial growing of the device channel. In this cross-section view, the word line stack, containing a plurality of word lines 1104 and insulation layers 1110, has been formed and patterned similarly to that shown in FIG. 4 and described above.

Figure 12:
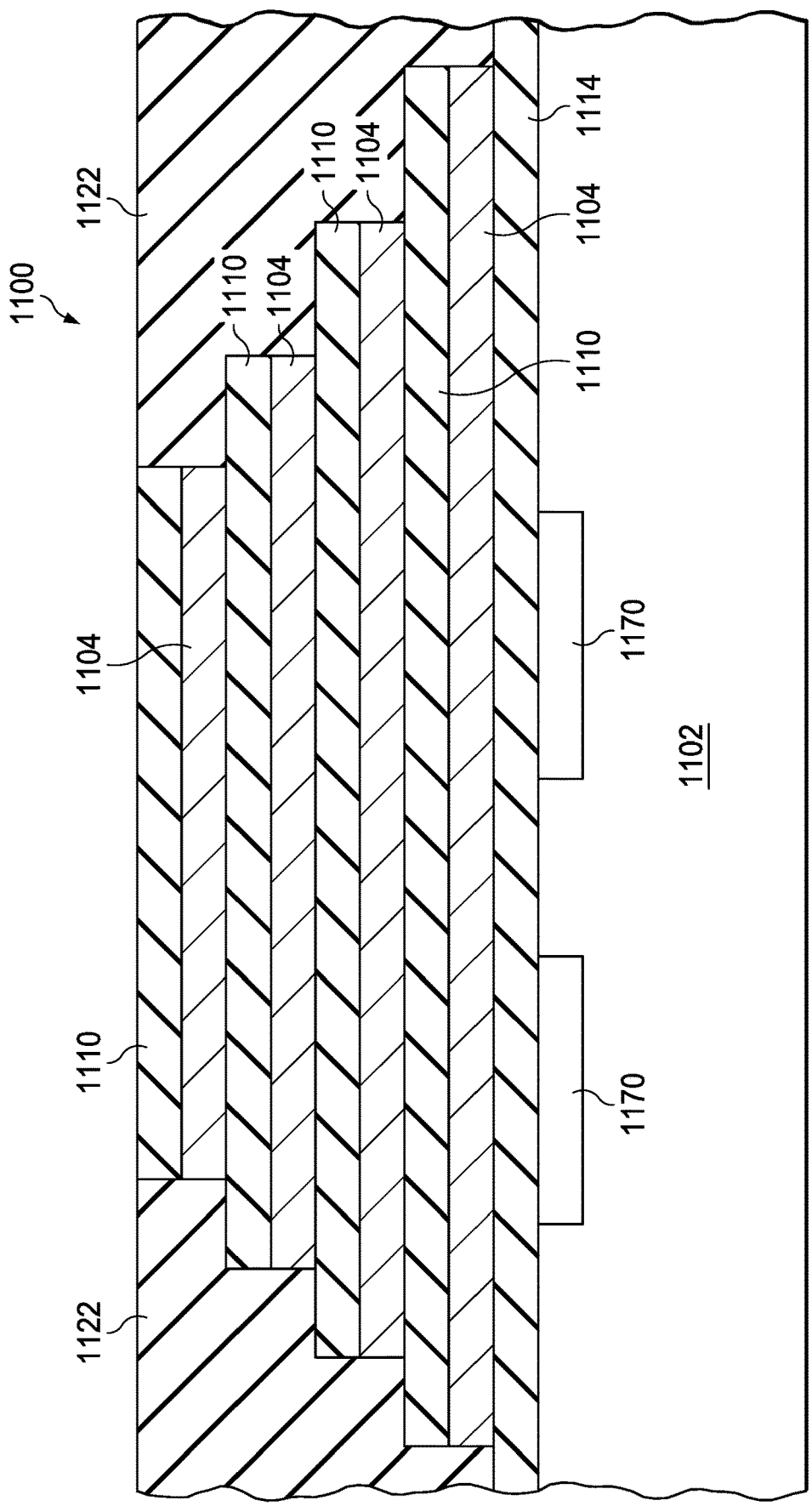
FIG. 12 is a cross-sectional view of a 3D NAND structure after planarizing with a dielectric in accordance with an illustrative embodiment.

In FIG. 12, a cross-sectional view of 3D NAND structure 1100 after planarizing with a dielectric is depicted in accordance with an illustrative embodiment. In this cross-sectional view, the 3D NAND structure 1100 has been planarized with an ILD oxide 1122.

Figure 13:
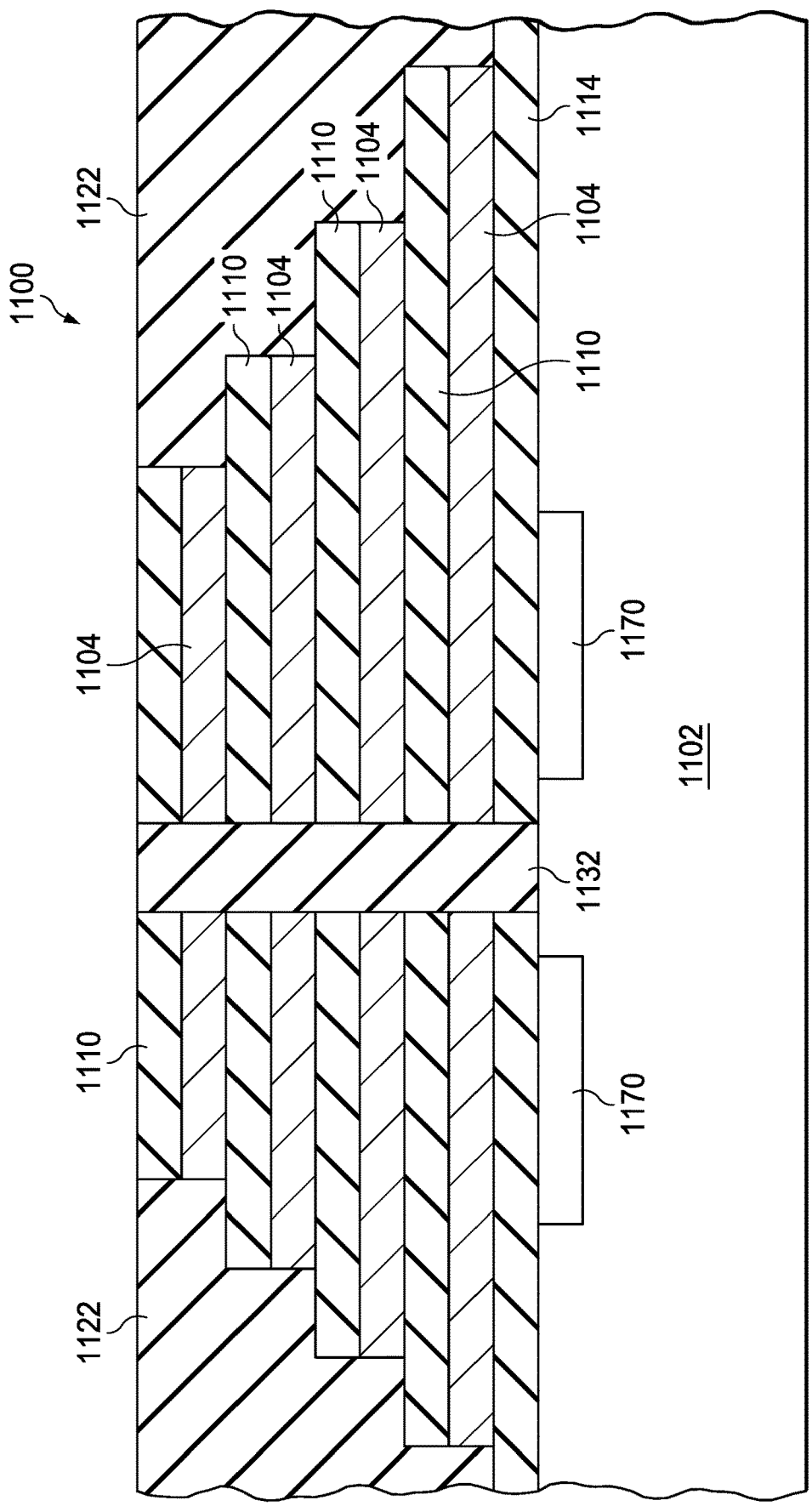
FIG. 13 is a cross-sectional view of a 3D NAND structure after etching a hole and filling the hole with dielectric in accordance with an illustrative embodiment.

In FIG. 13, a cross-sectional view of 3D NAND structure 1100 after etching a hole and filling the hole with dielectric is depicted in accordance with an illustrative embodiment. In this cross-sectional view, the 3D NAND structure 1100 has had a hole 1132 etched through the word lines 1104, the insulation layers 1110, and the dielectric cap 1114. The hole 1132 separates word lines 1104 in each layer of the 3D NAND structure 1100. After the hole 1132 has been etched, the hole is filled with an ILD oxide for isolation of the various word lines 1104, and the 3D NAND structure 1100 is planarized.

Figure 14:
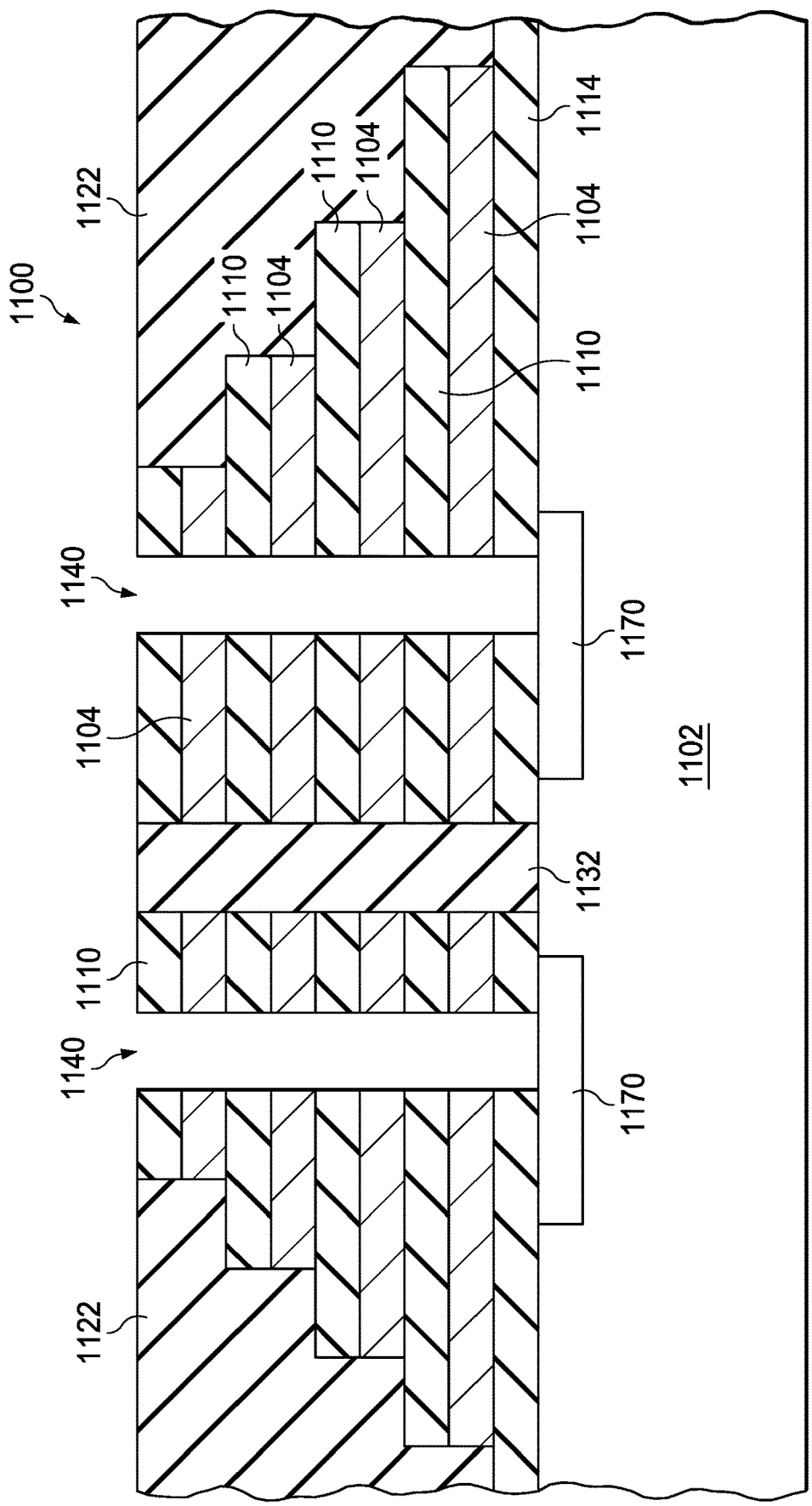
FIG. 14 is a cross-sectional view of a 3D NAND structure after etching of a hole for a channel for a floating gate in accordance with an illustrative embodiment.

In FIG. 14, a cross-sectional view of 3D NAND structure 1100 after etching of a hole for a channel for a floating gate is depicted in accordance with an illustrative embodiment. In this cross-sectional view, the 3D NAND 1100 has had holes 1140 etched through the word lines 1104, insulation layer 1110, and the dielectric cap 1114 such that the holes 1140 extend to the doped silicon layers 1170 in substrate 1102.

Figure 15:
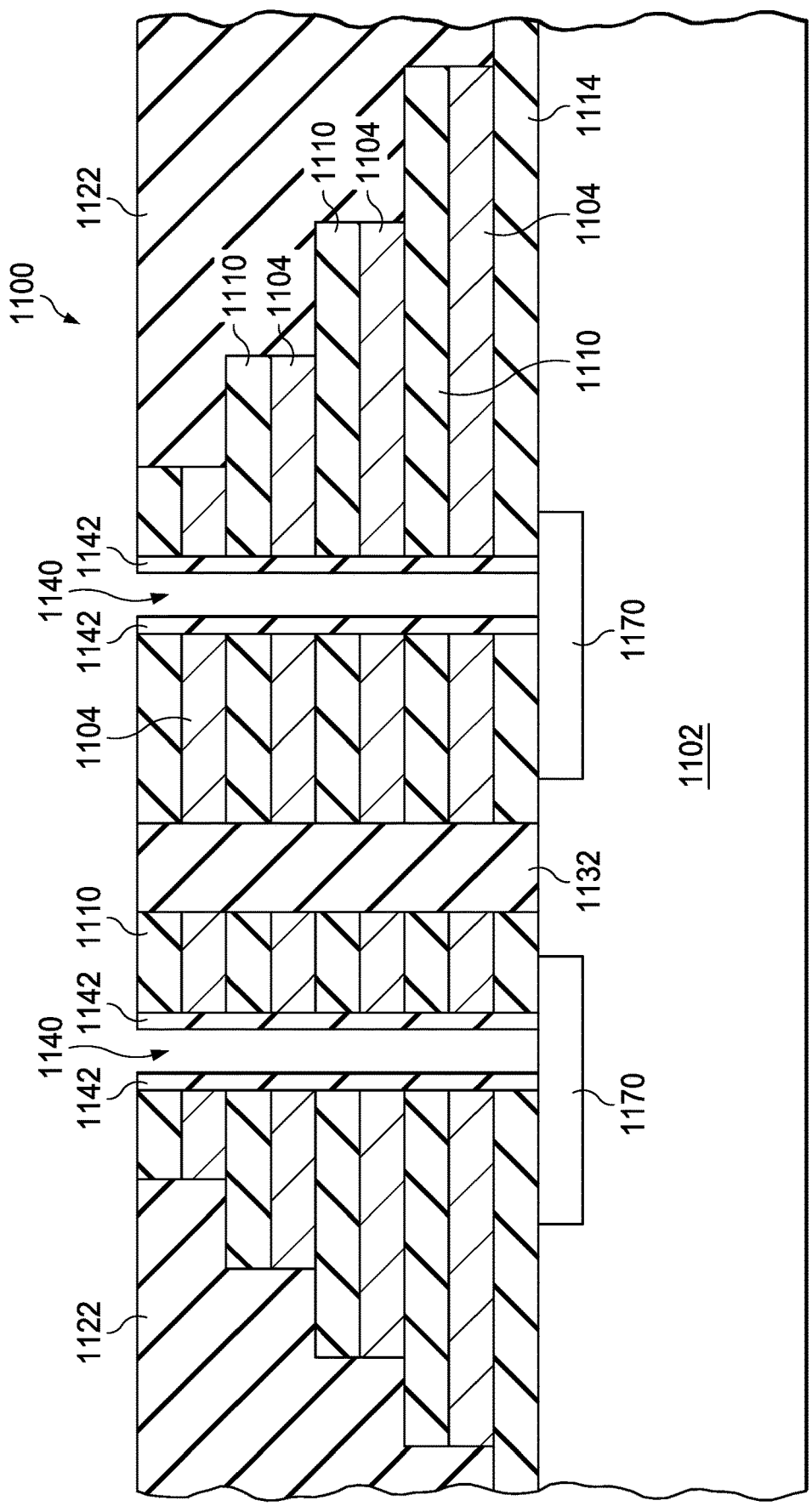
FIG. 15 is a cross-sectional view of a 3D NAND structure after depositing a floating gate trap and gate dielectric on the sides of each hole in accordance with an illustrative embodiment.

In FIG. 15, a cross-sectional view of 3D NAND structure 1100 after depositing a floating gate trap and gate dielectric on the sides 1142 of each hole 1140 is depicted in accordance with an illustrative embodiment. The floating gate trap and gate dielectric may be formed in a manner similar to that described above with respect to FIG. 7.

Figure 16:
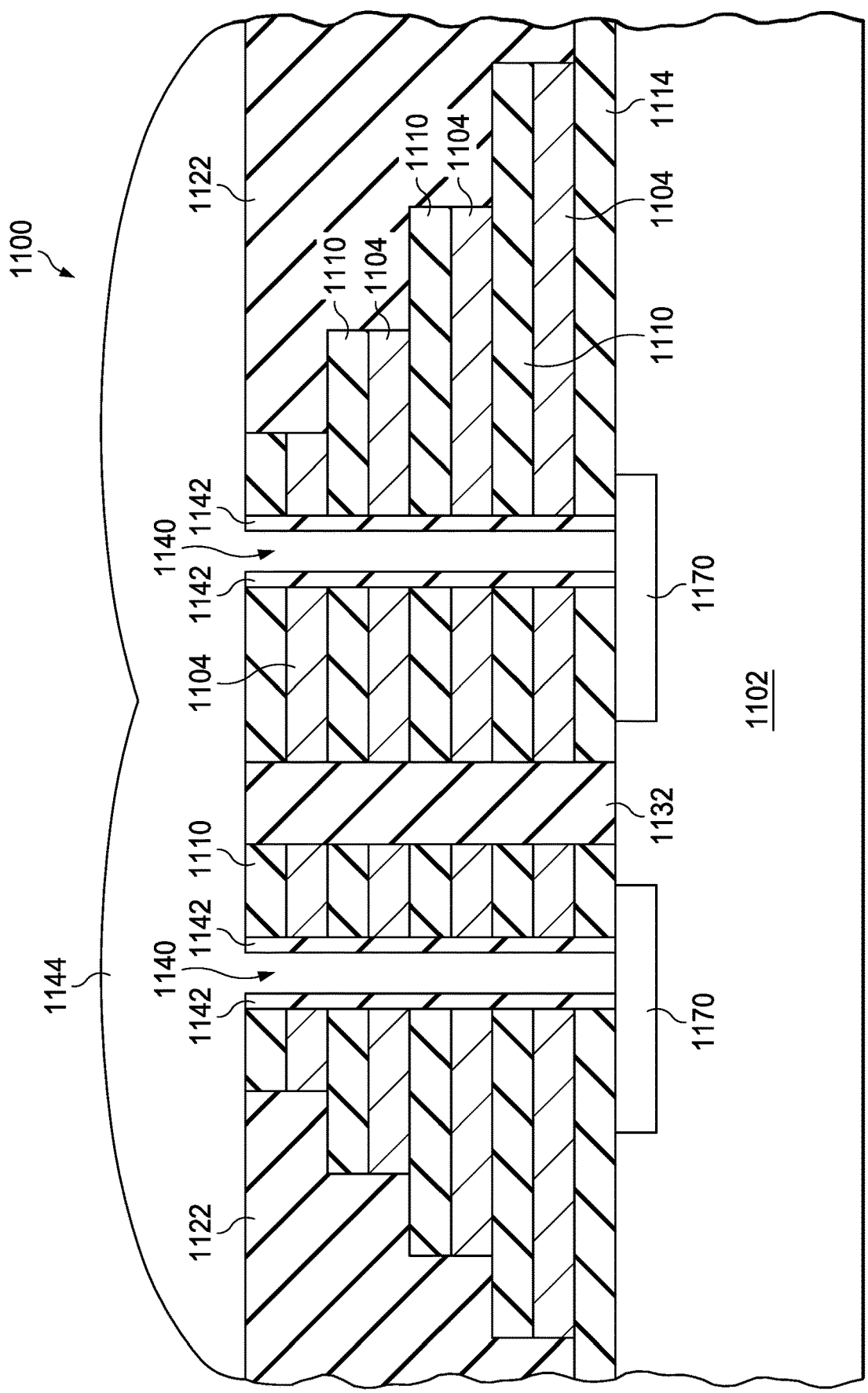
FIG. 16 is a cross-sectional view of a 3D NAND structure after an epitaxy lateral overgrowth has been formed in the hole and over the top surface of the NAND structure in accordance with an illustrative embodiment.

In FIG. 16, a cross-sectional view of 3D NAND structure 1100 after an epitaxy lateral overgrowth has been formed in the hole and over the top surface of the NAND structure 1100 is depicted in accordance with an illustrative embodiment. In this cross-sectional view, a channel 1144 has been epitaxially grown in the holes 1140 and has been laterally grown over the top surface of the 3D NAND structure 1100. The epitaxially grown semiconductor in each hole 1140 merge over the top of the 3D NAND structure 1100. The epitaxial lateral overgrowth channel 1144 may be formed in a substantially similar manner to that described above with reference to FIG. 8.

Figure 17:
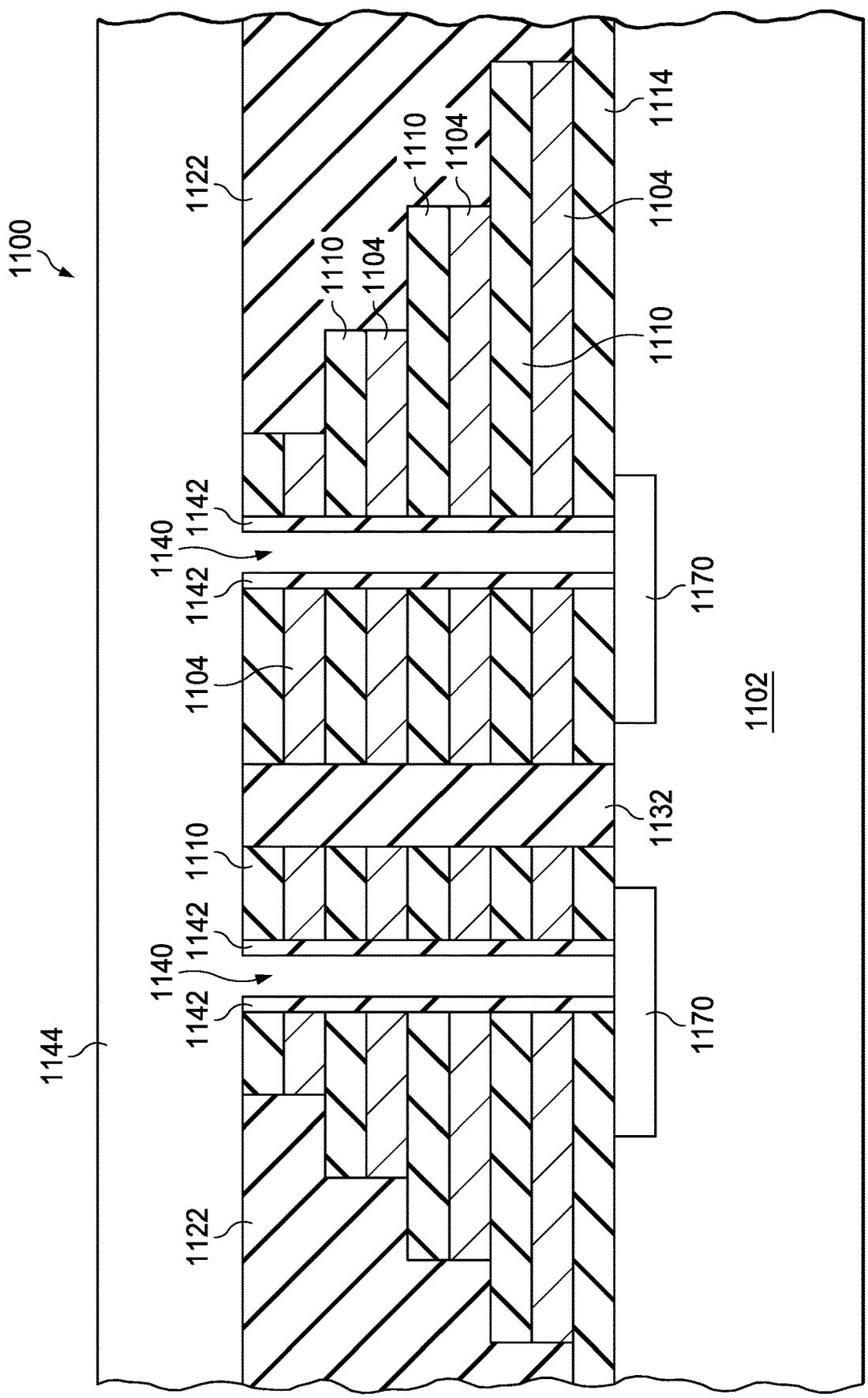
FIG. 17 is a cross-sectional view of a 3D NAND structure after polishing the epitaxial grown area as depicted in accordance with an illustrative embodiment.

In FIG. 17, a cross-sectional view of 3D NAND structure 1100 after polishing the epitaxial grown area is depicted in accordance with an illustrative embodiment. In this cross-sectional view, the epitaxial lateral overgrowth channel 1144 has been polished and planarized.

Figure 18:
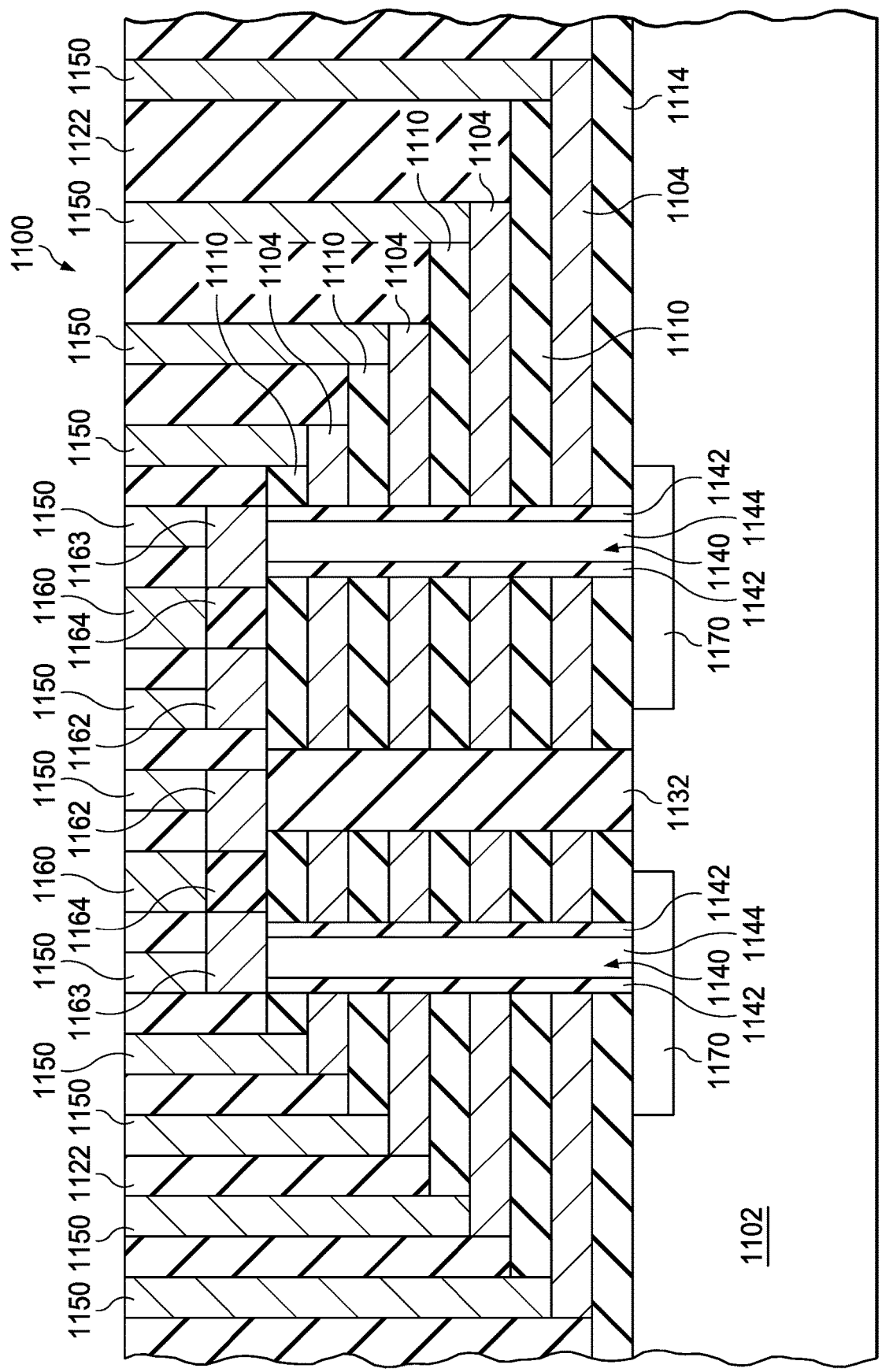
FIG. 18 is a cross-sectional view of a 3D NAND structure after forming logic devices on top of the word lines in accordance with an illustrative embodiment.

In FIG. 18, a cross-sectional view of 3D NAND structure 1100 after forming logic devices on top of the word lines 1104 is depicted in accordance with an illustrative embodiment. In this cross-sectional view, logic devices having a source 1162, drain 1163, gate 1160, and channel 1164 are formed over the top of insulation layer 1110. Word line contacts 1150 are also formed in the 3D NAND structure 1100. The resultant 3D NAND structure 1100 depicted in FIG. 18 includes a channel with substantially uniform crystal orientation thereby substantially eliminating or reducing threshold voltage fluctuation as compared to channels formed from polysilicon.

Thus, in an illustrative embodiment, a three-dimensional (3D) Not AND (NAND) memory structure includes a bit line, a floating gate, and a word line stack. The floating gate includes a channel. The channel includes a semiconductor with a substantially uniform crystal orientation. The word line stack includes a first portion and a second portion. The first portion is separated from the second portion by the floating gate. In an embodiment, the channel includes a first channel region and a second channel region and wherein the first channel region comprises a higher concentration of p-doped semiconductor than the second channel region. In an embodiment, the second channel region is proximate to the bit line. In an embodiment, the higher p-doped semiconductor includes a semiconductor, doped with a dopant, selected from a group comprising indium, and diborane.

As a result, the processes illustrated in FIGS. 2-10 and 11-18 overcome a technical problem with fluctuating threshold voltages for floating gates that utilize polysilicon as the device channel. One or more technical solutions are present in the illustrative example that decreases the threshold voltage fluctuation for the floating gates for 3D NAND structures.

The illustration of process for fabricating the 3D NAND structures in FIGS. 2-18 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

Figure 19:
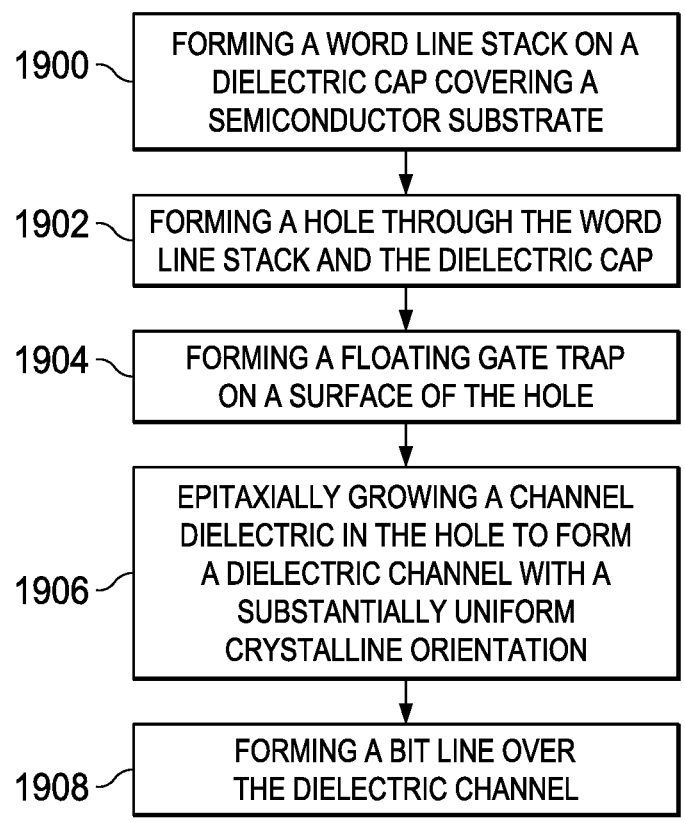
FIG. 19 is a flowchart of a process for fabricating a 3D NAND with a floating gate in accordance with an illustrative embodiment.

Turning next to FIG. 19, a flowchart of a process for fabricating a 3D NAND with a floating gate is depicted in accordance with an illustrative embodiment. The process illustrated in FIG. 19 can be implemented to perform the steps described for fabricating a 3D NAND depicted in FIGS. 2-10 or to perform the steps described for fabricating a 3D NAND depicted in FIGS. 11-18.

The process begins by forming a word line stack on a dielectric cap covering a semiconductor substrate (step 1900). In an embodiment, forming a word line stack comprises depositing a word line stack on a dielectric cap covering a semiconductor substrate, wherein the word line stack includes a plurality of metal layer word lines, where each of the plurality of metal layer word lines is separated from another of the plurality of metal layer word lines by an insulation layer. The semiconductor substrate may include a plurality of logic elements. The process forms a hole through the word line stack and the dielectric cap (step 1902). The hole may be formed by an etching process.

The process then forms a floating gate trap on a surface of the hole (step 1904). Next, the process epitaxially grows a device channel in the hole to form a device channel with a substantially uniform crystalline orientation (step 1906). In some embodiments, a region of higher p-type doped semiconductor is grown first near the bottom of the channel, while other regions above this region have a lower concentration of p-type doped semiconductor. In some embodiments, a region of higher n-type doped semiconductor is grown first near the bottom of the channel while other regions above this region have a lower concentration of n-type doped semiconductor. Examples of a dopant for use in creating the p-type doped semiconductor include arsine, phosphine, and diborane. Examples of a dopant for use in creating the n-type doped semiconductor include phosphorus and arsenic. Several methods may be utilized to epitaxially grow the channel. Examples of these methods include vapor-phase epitaxy (VPE), chemical vapor deposition (CVD), molecular-beam epitaxy (MBE), and liquid-phase epitaxy (LPE). The process then forms a bit line over the channel (step 1908). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figure. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, additional steps showing forming the floating channel or other materials for forming metal or dielectric layers may be present although not described in the flowcharts. In yet another illustrative example, one or more additional logic devices may be fabricated above the word lines and floating gate or may be fabricated before fabrication of the word lines and floating gate.

Thus, illustrative embodiments of the present invention provide a computer implemented method, computer system, and computer program product for fabricating a 3D NAND structure. The process begins by forming a word line stack on a dielectric cap covering a semiconductor substrate. The process forms a hole through the word line stack and the dielectric cap. The process forms a floating gate trap on a surface of the hole. The process epitaxially grows a channel in the hole to form a channel with a substantially uniform crystalline orientation. The process forms a bit line over the channel.

The process utilized to create the structure, results in 3D NAND structures with better performance due to lower fluctuation in threshold voltage.

The methods and structures that have been described above with reference to figures in the different examples may be employed in any electrical device including integrated circuit chips. The integrated circuit chips including the disclosed structures and formed using the disclosed methods may be integrated with other chips, discrete circuit elements, and/or other signal processing devices as part of either an intermediate product, such as a motherboard, or an end product. The end product can be any product that includes integrated circuit chips, including computer products or devices having a display, a keyboard or other input device, and a processor unit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for fabricating a three-dimensional (3D) Not AND (NAND) memory structure, the method comprising:

forming a word line stack on a dielectric cap covering a semiconductor substrate;

forming a hole through the word line stack and the dielectric cap;

forming a floating gate trap on a surface of the hole;

epitaxially growing a semiconductor in the hole to form a device channel with a substantially uniform crystalline orientation, wherein:

the epitaxial growth of the semiconductor extends from a lowermost portion of the hole; and the lowermost portion of the hole is below an uppermost surface of the dielectric cap; and forming a bit line over the device channel, wherein the epitaxial growth of the semiconductor comprises epitaxially growing one of a higher concentration of p-type doped semiconductor and a higher concentration of n-type doped semiconductor in a first region of the device channel than is grown in a second region of the device channel.

2. The method of claim 1, wherein the higher concentration of p-type doped semiconductor comprises a semiconductor doped with a dopant selected from a first group comprising arsine, phosphine, and diborane, and wherein the higher concentration of n-type doped semiconductor comprises a semiconductor doped with a dopant selected from a second group comprising phosphorus and arsenic.

3. The method of claim 1, wherein the semiconductor is selected from a group comprising silicon, germanium, and gallium arsenide.

4. The method of claim 1, wherein epitaxial growth of the semiconductor comprises one of vapor-phase epitaxy (VPE), chemical vapor deposition (CVD), molecular-beam epitaxy (MBE), and liquid-phase epitaxy (LPE).

5. The method of claim 1, wherein the forming the word line stack comprises depositing the word line stack on a dielectric cap covering a semiconductor substrate, the word line stack comprising a plurality of metal layer word lines, wherein each of the plurality of metal layer word lines is separated from another of the plurality of metal layer word lines by an insulation layer.

6. The method of claim 5, wherein the semiconductor substrate comprises a plurality of logic elements.

7. The method of claim 6, further comprising:
forming the plurality of logic elements over the plurality of metal layer word lines.

8. The method of claim 6, further comprising:
forming the plurality of logic elements under the plurality of metal layer word lines.

9. The method of claim 8, wherein the plurality of logic elements is formed prior to forming the plurality of metal layer word lines, the device channel, the bit line, and the floating gate trap.

10. The method of claim 1, further comprising:
patterning the word line stack to produce a patterned word line stack; and planarizing the patterned word line stack with a dielectric; and wherein forming the hole through the word line stack and the dielectric cap comprises etching the hole through the patterned word line stack and the dielectric cap.

11. A three-dimensional (3D) Not AND (NAND) memory structure comprising:

a bit line;

a floating gate comprising a device channel, wherein the device channel comprises a semiconductor with a substantially uniform crystal orientation; and a word line stack comprising a first portion and a second portion, wherein:

the first portion is separated from the second portion by the floating gate;

the word line stack is disposed on a dielectric cap; and material forming the floating gate has a lowermost surface that is disposed below an uppermost surface of the dielectric cap, wherein the device channel comprises a first channel region and a second channel region and wherein the first channel region comprises a higher concentration of one of a higher p-type doped semiconductor and a higher n-type doped semiconductor than the second channel region.

12. The 3D NAND memory structure of claim 11, wherein the second channel region is proximate to the bit line.

13. The 3D NAND memory structure of claim 11, wherein the higher p-type doped semiconductor comprises a semiconductor doped with a dopant selected from a first group comprising arsine, phosphine, and diborane, and wherein the higher n-type doped semiconductor comprises a semiconductor doped with a dopant selected from a second group comprising phosphorus and arsenic.

14. The 3D NAND memory structure of claim 13, wherein the semiconductor is selected from a group comprising silicon, germanium, and gallium arsenide.

15. The 3D NAND memory structure of claim 11, further comprising:
a plurality of logic devices formed above the word line stack.

16. The 3D NAND memory structure of claim 11, further comprising:
a plurality of logic devices formed below the word line stack.

17. The 3D NAND memory structure of claim 11, wherein the word line stack comprises a plurality of word lines and a plurality of insulation layers, and wherein each of the plurality of word lines is separated from another of the plurality of word lines by a respective insulation layer.

18. The 3D NAND memory structure of claim 17, wherein the word lines comprise a material selected from a group comprising tungsten (W), titanium nitride (TiN), and doped polysilicon.

* * * * *